United States Patent
Kuhara

[19]

[11] Patent Number: 5,978,427
[45] Date of Patent: Nov. 2, 1999

[54] PHASE-LOCKED LOOP CIRCUIT HAVING A LOCK STATE DETECTING FUNCTION

[75] Inventor: Shigeru Kuhara, Tokyo, Japan

[73] Assignee: NEC Corporation, Tokyo, Japan

[21] Appl. No.: 08/916,399

[22] Filed: Aug. 22, 1997

[30] Foreign Application Priority Data

Aug. 28, 1996 [JP] Japan .................................... 8-226580

[51] Int. Cl.$^6$ ....................................................... H04L 7/06
[52] U.S. Cl. ................................ 375/376; 331/17; 331/25
[58] Field of Search .................................... 375/375, 376; 331/12, 17, 25, DIG. 2; 327/147, 149, 156, 158

[56] References Cited

U.S. PATENT DOCUMENTS

| | | | |
|---|---|---|---|
| 4,494,021 | 1/1985 | Bell et al. ............................... | 327/262 |
| 4,513,427 | 4/1985 | Borriello et al. ........................ | 375/360 |
| 5,043,677 | 8/1991 | Tomassetti et al. ..................... | 331/2 |
| 5,050,194 | 9/1991 | Pickering et al. ....................... | 375/357 |

FOREIGN PATENT DOCUMENTS

| | | |
|---|---|---|
| 54-130861 | 10/1979 | Japan . |
| 64-24630 | 1/1989 | Japan . |

*Primary Examiner*—Stephen Chin
*Assistant Examiner*—Lenny Jiang
*Attorney, Agent, or Firm*—Young & Thompson

[57] ABSTRACT

A PLL circuit detects a locked state as keeping always constant the ratio of an input signal to a locked state detection reference value by automatically and continuously changing the locked state detection reference value even when the frequency of the input signal is changed. A division ratio of a frequency divider in the PLL circuit is changed in response to an external signal. An analog signal Vc which is output from a loop filter 3 is applied to a delay circuit 7. When the analog signal Vc rises, a delay time Td of the delay circuit 7 decreases. The locked state detection reference value varies according to the frequency of the signal f1.

4 Claims, 6 Drawing Sheets

PHASE-LOCKED LOOP CIRCUIT HAVING A LOCK STATE DETECTING FUNCTION

BACKGROUND OF THE INVENTION

1. Field of the Invention

The present invention relates to a phase-locked loop (PLL) circuit, and particularly to a PLL circuit provided with a circuit for judging whether or not a difference in phase between an input signal and an output signal is equal to or less than a certain reference value, regardless of the period of the input signal.

2. Description of the Related Art

As an example, a PLL circuit which is mounted on a single-chip microcomputer and generates an internal clock signal inside the chip through receiving a clock signal from the outside is described in the following.

When a difference in phase between an external clock signal and an internal clock signal is too large, a single-chip microcomputer does not normally operate. Therefore, a circuit which detects a locked state of a PLL circuit is required in order to judge whether or not the difference in phase is within a range in which the single-chip microcomputer can normally operate.

As a method for detecting a locked state of such a PLL circuit, a circuit which detects a locked state of a PLL circuit by comparing a pulse width of a pulse outputted from a phase comparator circuit according to a difference in phase between an input signal and a feedback signal with a delay time of a delay circuit with each other has been disclosed in a Japanese laid-open publication Tokkaisho No. 64-24630.

FIG. 9 is a block diagram of a PLL circuit disclosed in the above-mentioned publication. This PLL circuit is composed of a phase comparator circuit 1, a charge pumping circuit 2, a loop filter 3, a voltage controlled oscillator (VCO) circuit 4, a frequency divider circuit 5, an exclusive NOR circuit 6, delay circuits 71, 72 to 7n, D flip-flop circuits 81, 82 to 8n, and a change-over switch 9.

The phase comparator circuit 1 is a phase comparator circuit of a digital type using a sequential circuit and the like, and generates an up pulse Pu for raising the frequency of a feedback signal f2 or a down pulse Pd for lowering the frequency of a feedback signal f2 according to a difference in phase between an input signal f1 and the feedback signal f2. The pulse signal Pu or Pd is converted into a voltage pulse by the charge pumping circuit 2 and is made into an analog signal Vc by the loop filter 3 having an integrating function. This analog signal Vc is applied to the VCO circuit 4, and varies the frequency of an oscillating output f0 of the VCO circuit 4. The oscillating output f0 of the VCO circuit 4 is an output of the PLL circuit and is fed back to the phase comparator circuit 1 through the frequency divider circuit 5.

When the input signal f1 is faster in phase than the feedback signal f2, an up pulse Pu is generated according to the difference in phase and the oscillating frequency of the oscillating output f0 of the VCO circuit 4 is raised. Contrarily, when the input signal f1 is slower in phase than the feedback signal f2, a down pulse Pd is generated and the oscillating frequency of the oscillating output f0 is lowered.

An output pulse Pu or Pd obtained from the phase comparator circuit 1 is applied to a clock input terminal of the flip-flop circuit 8 through the logic circuit 6, and is applied to a D terminal of the flip-flop circuit 8 through one of the delay circuits 7. The flip-flop circuit 8 takes in a signal state of the D terminal at the leading edge of a pulse signal applied to the clock input terminal. An output signal SL obtained from the flip-flop circuit 8 becomes a locked state detection signal.

In this way, a delay time of the delay circuit 7 becomes a criterion for judging a locked state. Therefore, in order to change a locked state judgment criterion according to frequencies, in this circuit the delay circuits 71, 72 to 7n have, respectively, delay times Td1, Td2 to Tdn different from one another.

According to such a configuration as described above, by selecting a specified output from outputs of the flip-flop circuits 81, 82 to 8n by changing the change-over switch 9, it is possible to detect a locked state while always keeping constant the ratio of an input frequency to a delay time of the delay circuits, namely, the ratio of an input frequency to a difference in phase between an input signal f1 and a feedback signal f2.

However, since the above-mentioned PLL circuit of the prior art which detects a locked state by changing over plural delay circuits needs a means for changing over the delay circuits and has to have, for example, a signal terminal newly added to the chip, which is not desirable. And it is necessary to monitor an input frequency by some means and also have a procedure for changing a change-over switch each time the input frequency changes.

SUMMARY OF THE INVENTION

Therefore, an object of the invention is to provide a PLL circuit which can remove such disadvantages of the prior art as described above and can detect a locked state while always keeping constant the ratio of an input signal frequency to a delay time by automatically and continuously changing a locked state detection reference value, namely, a delay time of the delay circuit in case the frequency of an input signal changes.

Another object of the invention is to provide a PLL circuit which can detect a locked state while always keeping constant the ratio of a frequency of an input signal to a locked state detection reference value even when the frequency division ratio of a frequency divider circuit changes.

A PLL circuit of the invention comprises:
- a phase comparator circuit which generates a first pulse signal and a second pulse signal according to a difference in phase between an input signal and a feedback signal,
- a circuit for generating a control signal according to said first pulse signal and said second pulse signal,
- an oscillator circuit for changing its output frequency according to said control signal,
- a logic circuit which receives said first and second pulse signals outputted from said phase comparator circuit and outputs one of said first and said second pulse signals,
- a delay circuit which varies its delay time according to the size of said control signal and delays an output pulse signal of said logic circuit by said delay time, and
- a D flip-flop circuit which receives said output pulse signal of said logic circuit to a clock input terminal, receives an output pulse signal of said delay circuit to a data input terminal, and outputs a lock state detection signal.

According to the above-mentioned composition, since the delay time of the delay circuit varies with an internal control signal correlated to an input signal, it is possible to always keep constant the ratio of an input signal to a locked state judgment reference value even when the input signal changes.

A PLL circuit of the invention furthermore comprises a frequency divider which is provided in an oscillating output feedback path between an output side of said oscillator circuit and said phase comparator circuit and changes its frequency division ratio by receiving an external signal, wherein the delay time of said delay circuit is controlled by said control signal and said external signal.

Thanks to this, the PLL circuit which changes its frequency division ratio can detect a locked state as keeping constant the ratio of an input signal to a difference in phase.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Figure 1:
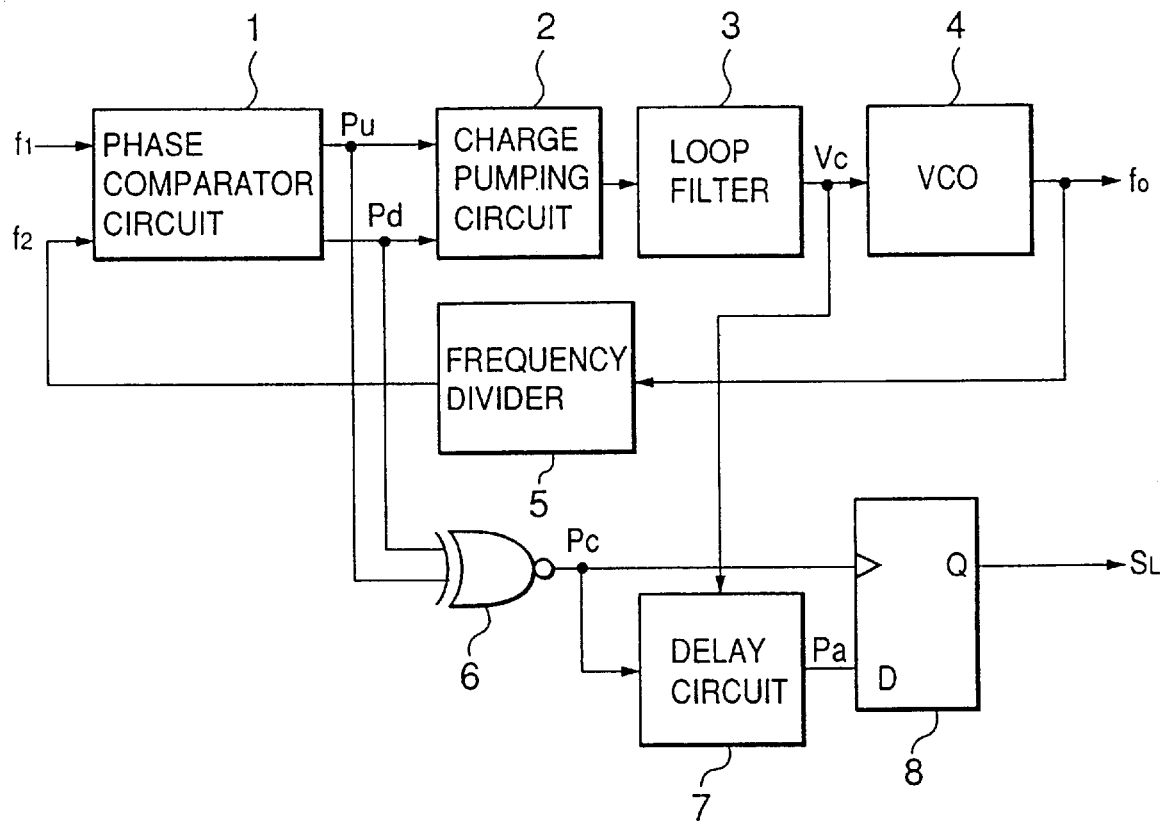
FIG. 1 is a configuration diagram of a PLL circuit of a first embodiment of the invention.
Figure 9:
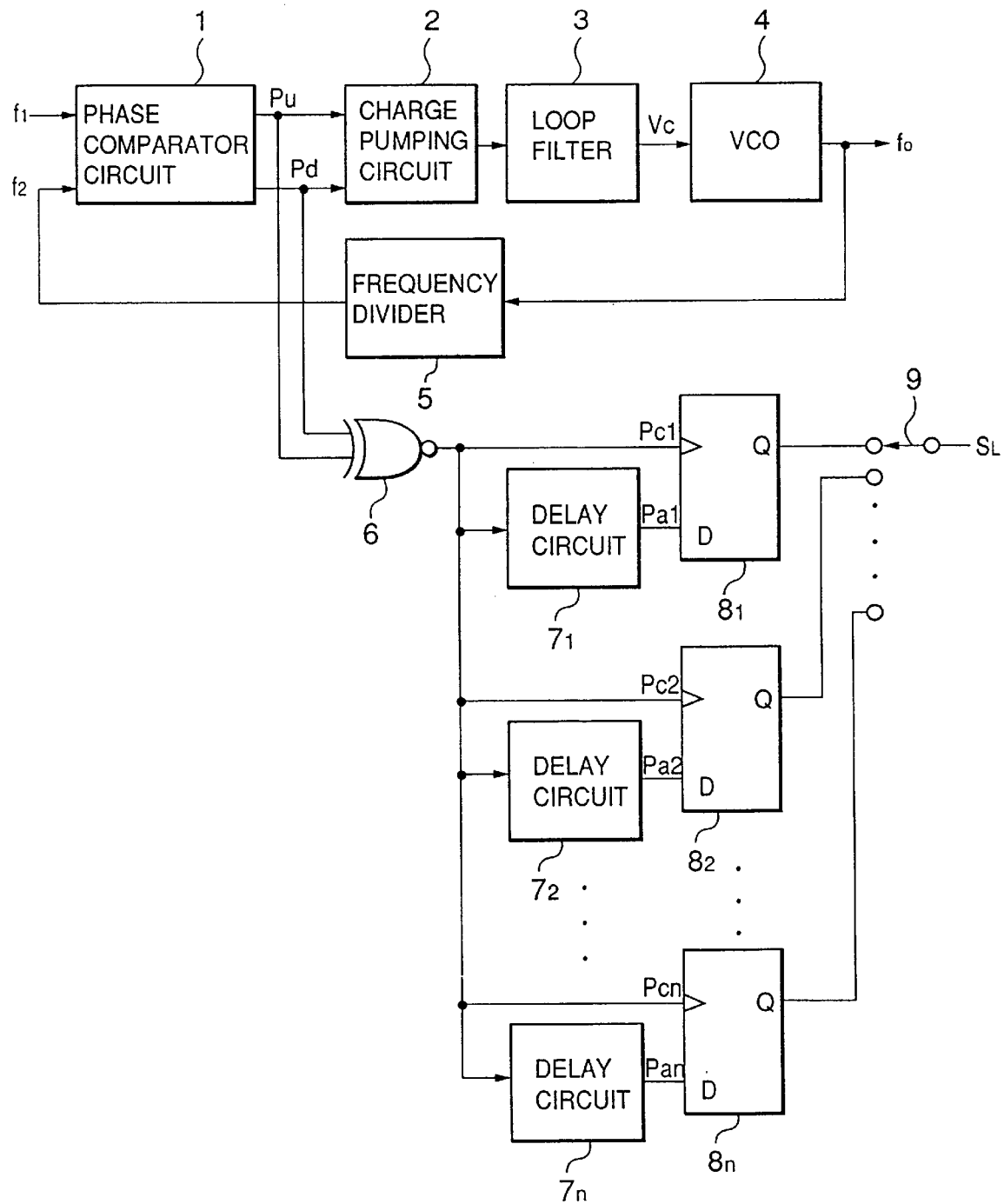
FIG. 9 is a circuit diagram of a PLL circuit of the prior art.

Referring to FIG. 1, a PLL circuit of a first embodiment of the invention is provided with a delay circuit 7 instead of delay circuits 71, 72 to 7n and a D flip-flop circuit 8 instead of D flip-flop circuits 81, 82 to 8n in a PLL circuit of the prior art of FIG. 9.

An output pulse Pu or Pd of a phase comparator circuit 1 is applied to a clock input terminal of the D flip-flop circuit 8 through an exclusive NOR circuit 6 and, is applied to a D terminal of the flip-flop circuit 8 through the delay circuit 7. The flip-flop circuit 8 takes in a signal state of the D terminal at the leading edge of a pulse signal applied to the clock input terminal. An output signal SL obtained from the D flip-flop circuit 8 becomes a locked state detection signal.

Figure 2:
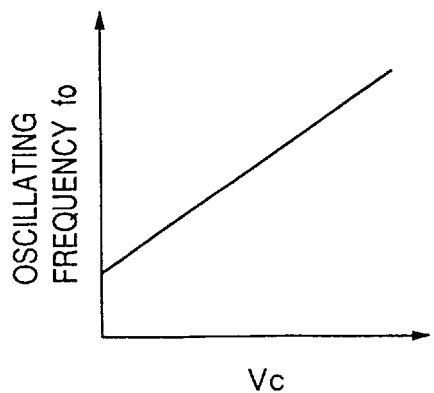
FIG. 2 is a figure for explaining the relation between a control voltage Vc and an oscillating frequency f0 of a VCO circuit 4.

An analog signal Vc is a signal for controlling the oscillating frequency of a VCO circuit 4. There is a strong correlation between the analog signal Vc and the oscillating frequency f0 in a frequency range in which the PLL circuit is used. As an example shown in FIG. 2, when the analog signal Vc rises, the oscillating frequency f0 of the VCO circuit 4 also increases monotonically. Accordingly, an oscillating frequency f0 can be obtained by an analog signal Vc. Assuming a locked state or a nearly locked state, there is a relation that the ratio of an input frequency f1 to the oscillating frequency f0 is nearly equal to a whole number. Accordingly, the frequency of an input signal f1 can be known from an analog signal Vc. The delay circuit 7 changes its delay time Td by having the analog signal Vc applied to it. When the analog signal Vc rises, namely, when the frequency of the input signal f1 increases, the delay time Td which is a reference value for detecting a locked state decreases (see FIG. 4).

As for a locked state judgment reference, for example, in case that a difference in phase of 5% between an input signal f1 and an oscillating output f2 is acceptable, a difference in phase of 5 ns is acceptable when the input signal f1 is 10 MHz.

On the contrary, a difference in phase of 0.5 ns is acceptable when the input signal f1 is 100 MHz.

Therefore, a proper correlation is set between an input signal f1 and a delay time Td according to an acceptable difference in phase. In such a way, it is possible to always keep constant the ratio of a frequency of an input signal f1 to a delay time of the delay circuit 7, namely, the ratio of the frequency of the input signal f1 to a locked state judgment reference value.

Figure 3:
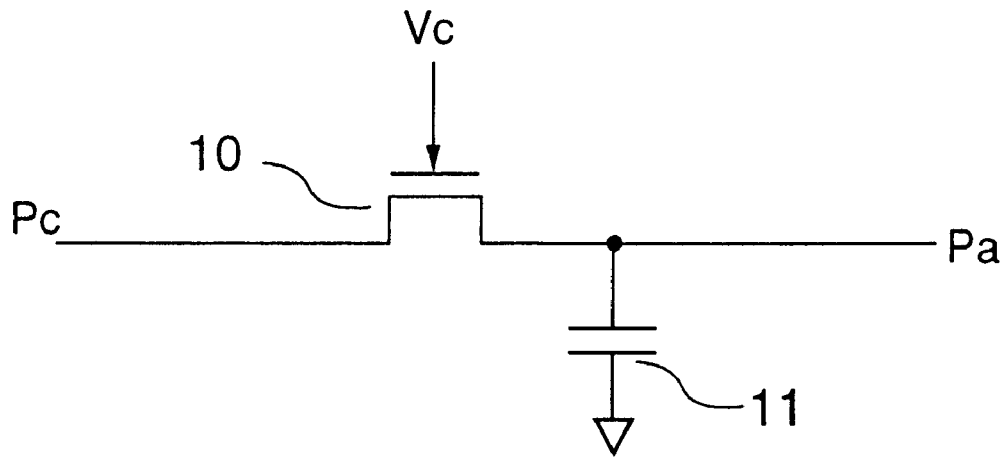
FIG. 3 is a circuit diagram showing an example of a delay circuit 7 of FIG. 1.
Figure 4:
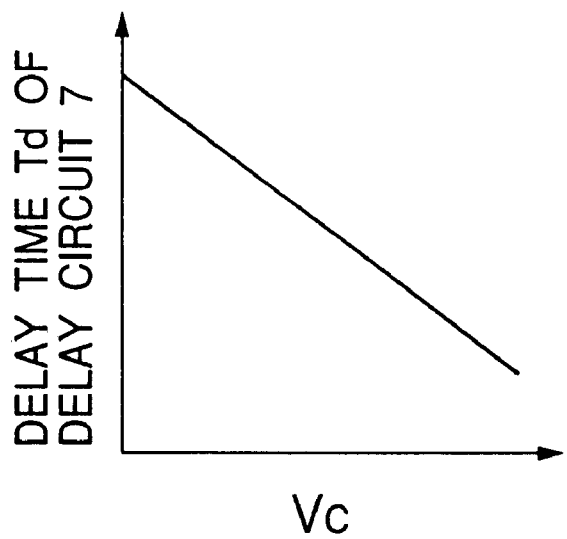
FIG. 4 is a figure for explaining the relation between a control voltage Vc and a delay time Td.

The delay circuit 7 varying its delay time according to applied signals may be composed, for example, of one or more resistor-capacitor delay elements having an NMOS FET 10 and a capacitance 11, as shown in FIG. 3 for example. A control signal Vc is applied to the gate of the NMOS FET 10. When the control signal Vc varies, the on-state resistance of the NMOS FET 10 is changed and as a result the RC delay time is changed. At this time, by selecting a proper dimension of the NMOS FET 10 and a proper capacitance value of the capacitance 11, the delay time varies with the control voltage Vc as shown in FIG. 4. Thus, a pulse Pa made by delaying an output Pc of the exclusive NOR circuit 6 by a delay time Td can be obtained.

Next, operation of a PLL circuit composed as described above is described in the following as using the waveform diagrams shown in FIGS. 5 and 6.

Figure 5:
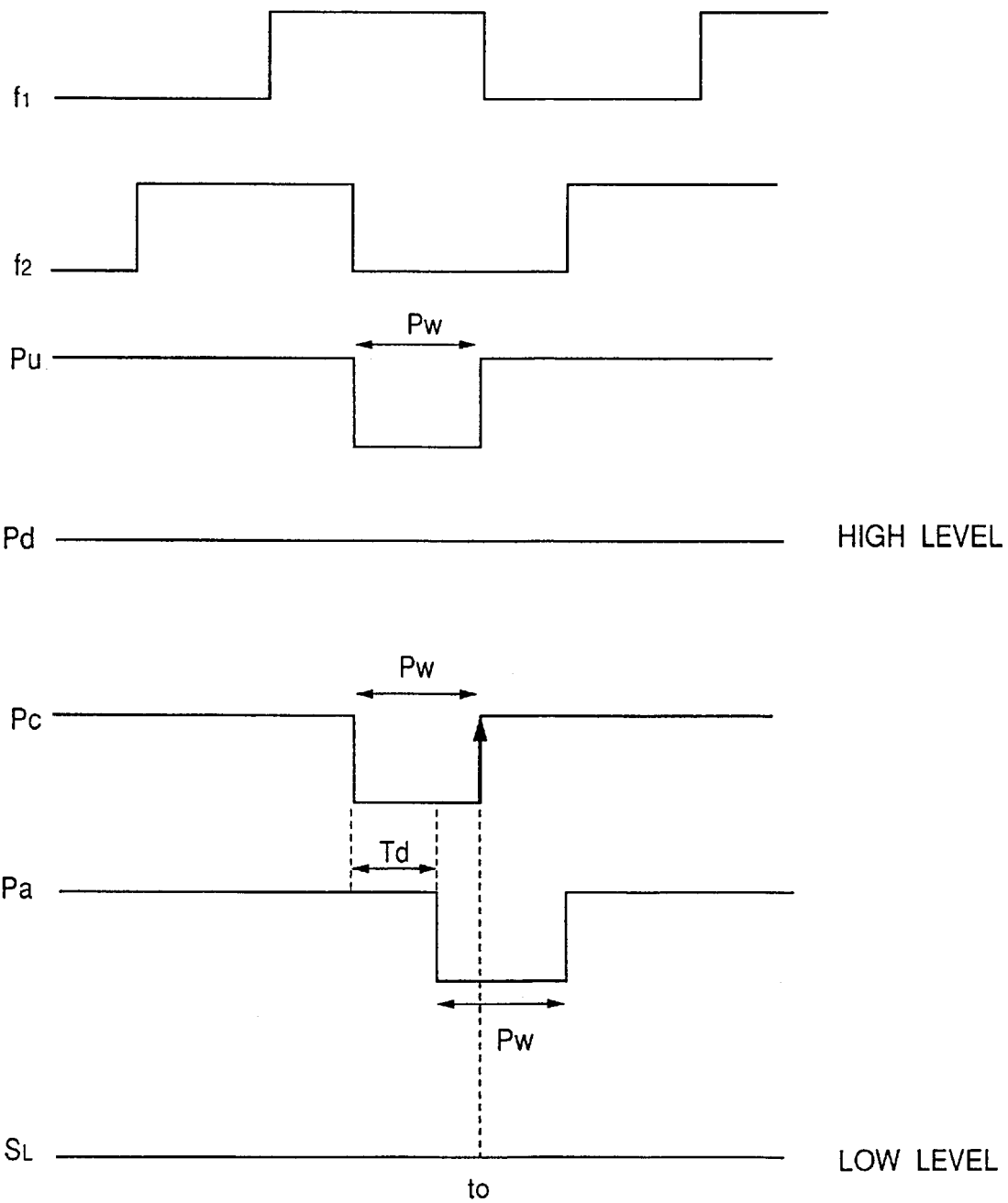
FIG. 5 is a timing chart showing a non-locked state of the PLL circuit of FIG. 1.
Figure 6:
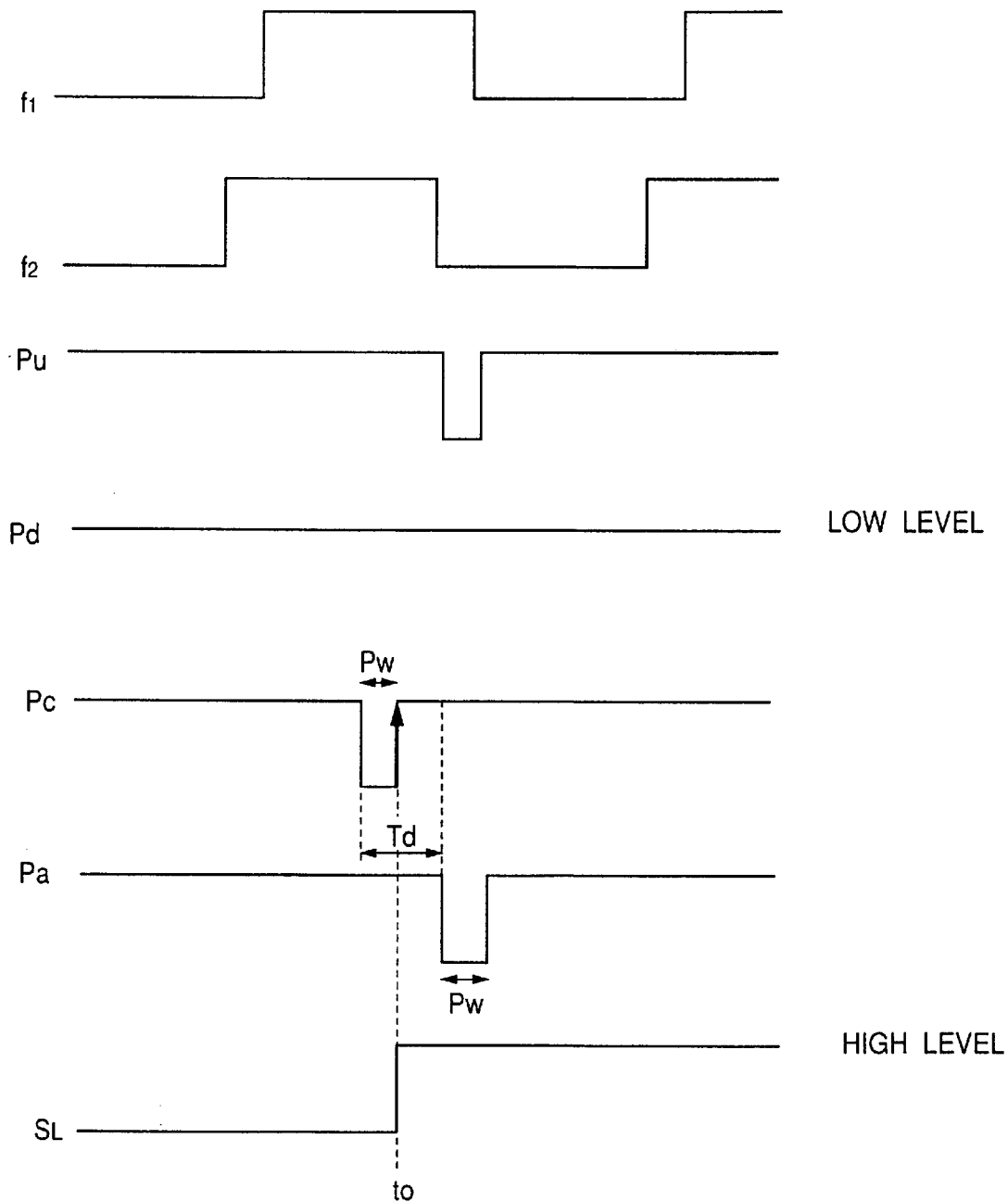
FIG. 6 is a timing chart showing a locked state of the PLL circuit of FIG. 1.

The relation among an input signal f1, a feedback signal f2, an up pulse Pu, a down pulse Pd, pulse signals Pc and Pa, and a locked state detection signal SL is shown by FIG. 5 in a non-locked state and is shown by FIG. 6 in a locked state.

As shown in FIG. 5, when an input signal f1 is faster in phase than a feedback signal f2, an up pulse is outputted according to the difference in phase between the input signal f1 and the feedback signal f2. Accordingly, a pulse signal Pc having a pulse width of Pw is outputted from the exclusive NOR circuit. In this way, in case that a difference in phase is large and the pulse width Pw of a pulse signal Pc and that of a pulse signal Pa which is delay time Td slower than Pc is greater than the delay time Td, the pulse signal Pa has been already applied to the D terminal at the rising time t0 of the pulse signal Pc. Since the potential of the Pa at that time is at a low level, the output signal SL of the D flip-flop circuit 8 comes to be at a low level showing a non-locked state.

On the contrary, as shown in FIG. 6, when the difference in phase between the input signal f1 and the feedback signal f2 becomes nearly zero, an up pulse Pu having a small pulse width is outputted according to the difference in phase. Accordingly, the pulse width Pw of a pulse signal Pc and a pulse signal Pa which is Td slower than Pc becomes smaller than Td, and the pulse signal Pa has not been applied yet to the D terminal at the rising time t0 of the pulse signal Pc. Since the potential of the Pa at that time is at a high level, the output signal SL comes to be at a high level and a locked state can be detected.

According to the first embodiment of the invention, as described above, it is possible to detect the locked state while always keeping constant the ratio of the input frequency to the delay time by automatically and continuously changing a detection reference value even when the frequency of the input signal is changed.

Figure 7:
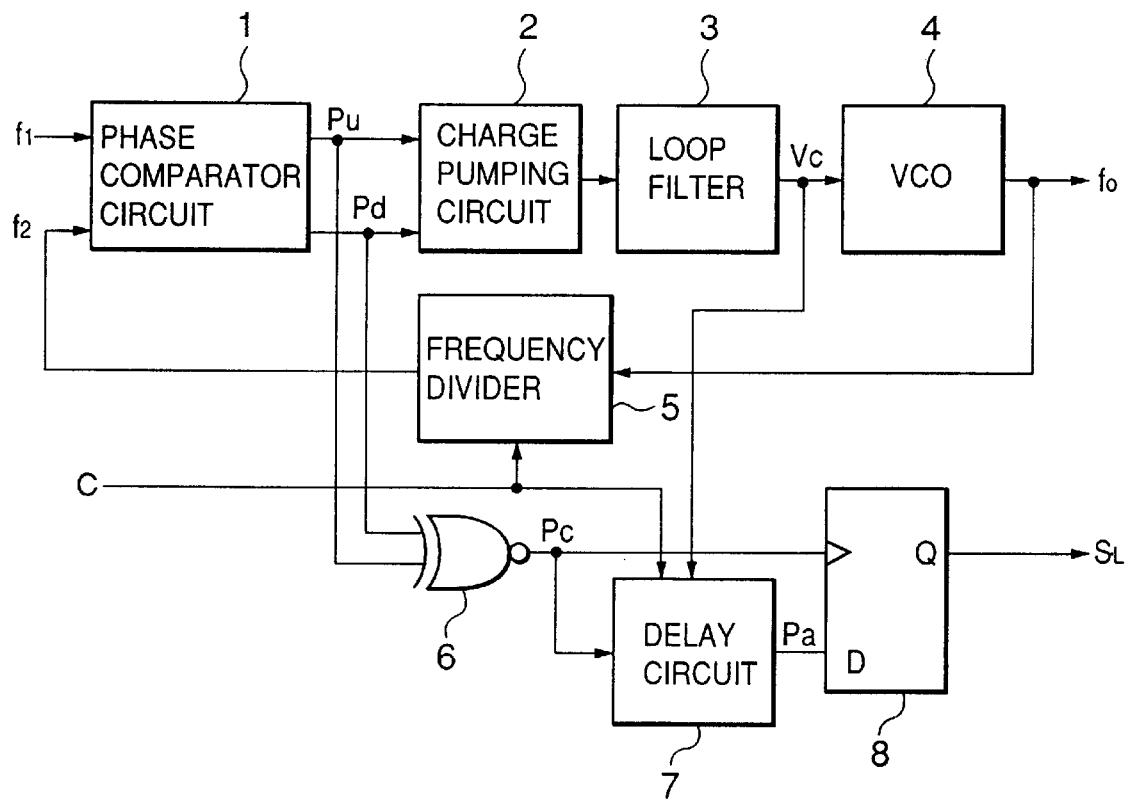
FIG. 7 is a configuration diagram of a PLL circuit of a second embodiment of the invention.

Referring to FIG. 7, a PLL circuit according to a second embodiment of the invention has a composition in which an external signal C is inputted into a frequency divider circuit 5 and the frequency division ratio of the frequency divider circuit 5 is changed. When an external signal C is at a high level, the frequency division ratio is 1 and when an external signal C is at a low level, the frequency division ratio is 2.

Consider the case where the frequency division ratio is 2. When a delay time of the delay circuit 7 is determined by only an analog signal Vc in the same way as a circuit of FIG. 1, the delay time of the delay circuit 7 is a delay time when the frequency of an input signal f1 is equal to the frequency of the oscillating output f0. However, the frequency of an input signal f1 is equal to ½ of the frequency of the oscillating output f0.

Therefore, when the delay time Td which is a locked state detection criterion is determined by only an analog signal Vc, it results in a criterion more severe than a detection criterion for the frequency of an input signal f1.

Thereupon, in the circuit of FIG. 7, an external signal C is also inputted into the delay circuit 7, and the delay time Td of the delay circuit 7 is controlled by the analog signal Vc and the external signal C.

Figure 8:
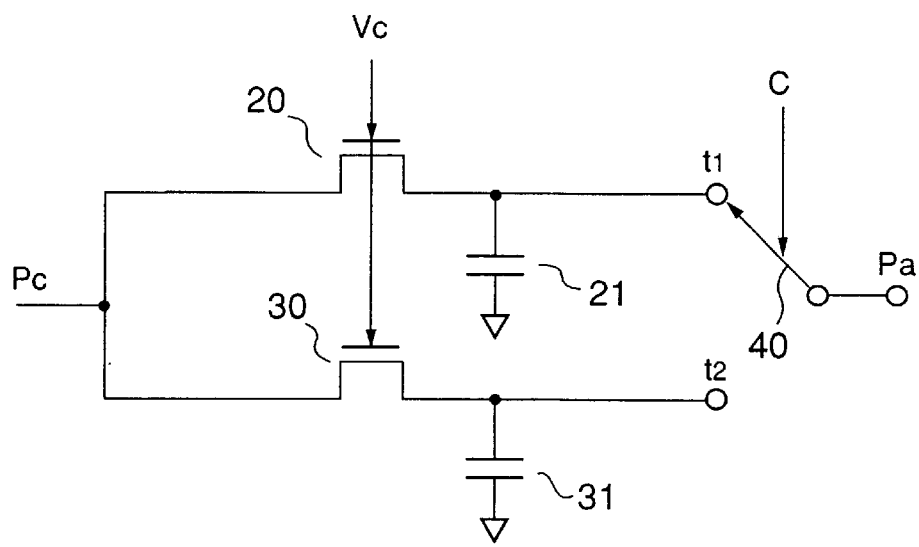
FIG. 8 is a circuit diagram showing an example of a delay circuit 7 of FIG. 7.

The delay circuit 7 according to this embodiment may be, for example, constituted as shown in FIG. 8. An output pulse Pc from the logic circuit 6 is inputted to a common connecting point at which one end of an NMOS FET 20 and one end of an NMOS FET 30 are connected to each other, and a capacitor 21 and a capacitor 31 are, respectively, connected in series to the other ends of the NMOS FETs 20 and 30. A control signal Vc is applied, respectively, to the gates of the NMOS FETs 20 and 30. The circuit has been designed so that the driving ability of the NMOS FET 30 is ½ of the driving ability of the NMOS FET 20. When an external signal C is at a high level, that is, when the frequency division ratio is 1, a switch 40 is connected to a terminal t1, and when the external signal C is at a low level, that is, when the frequency division ratio is 2, the switch 40 is connected to a terminal t2.

Further, the delay circuit 7 in FIG. 8 may be constituted by substituting NMOS FET 20 with two NMOS FETs having the same driving ability as the NMOS FET 30 being connected in parallel.

Thus, according to the second embodiment of the invention, as described above, it is possible to detect a locked state while keeping constant the ratio of an input frequency to a difference in phase even in a PLL circuit where the frequency division ratio is changed.

It is apparent that the present invention is not limited to the above embodiments, but may be modified and changed without departing from the scope and spirit of the invention.

What is claimed is:

1. A phase-locked loop (PLL) circuit comprising;

a phase comparator circuit which generates a first pulse signal and a second pulse signal according to a difference in phase between an input signal and a feedback signal, a circuit for generating a control signal according to said first pulse signal and said second pulse signal, an oscillator circuit for changing its output frequency according to said control signal, a logic circuit which receives said first and second pulse signals outputted from said phase comparator circuit and outputs one of said first and said second pulse signals, a delay circuit which varies its delay time according to the size of said control signal and delays an output pulse signal of said logic circuit by said delay time, a D flip-flop circuit which receives said output pulse signal of said logic circuit to a clock input terminal, receives an output pulse signal of said delay circuit to a data input terminal, and outputs a lock state detection signal, and a frequency divider in an oscillating output feedback path between an output side of said oscillator circuit and said phase comparator circuit changes its frequency division ratio by receiving an external signal, wherein the delay time of said delay circuit is controlled by said control signal and said external signal.

2. The phase-locked loop (PLL) circuit as claimed in claim 1, wherein;

said delay circuit comprises a MOSFET whose gate receives said control signal and a capacitor connected in series to said MOSFET.

3. The phase-locked loop (PLL) circuit as claimed in claim 1, wherein;

said delay circuit has a plurality of MOSFETs, a gate of said MOSFETs each receiving said control signal, ends of said MOSFETs connected commonly to each other to receive the output of said logic circuit, and other ends of said MOSFETs each connected in series to a capacitor, and said delay circuit outputs said output pulse signal from one of said other ends of said MOSFETs according to said external signal.

4. The phase-locked loop (PLL) circuit as claimed in claim 1, wherein;

said output frequency of said oscillator circuit monotonically increases with said control signal and said delay time of said delay circuit monotonically decreases with said control signal.

\* \* \* \* \*